(12) United States Patent
Merkle et al.

(10) Patent No.: US 11,255,882 B2
(45) Date of Patent: Feb. 22, 2022

(54) MONITORING AN ENERGY PARAMETER IN A DISTRIBUTION STATION

(71) Applicant: ENBW ENERGIE BADEN-WURTTEMBERG AG, Karlsruhe (DE)

(72) Inventors: Denis Merkle, Neuhausen (DE); Andreas Hettich, Fellbach (DE)

(73) Assignee: EnBW Energie Baden-Wurttemberg AG, Karlsruhe (DE)

( * ) Notice: Subject to any disclaimer, the term of this patent is extended or adjusted under 35 U.S.C. 154(b) by 0 days.

(21) Appl. No.: 16/650,830

(22) PCT Filed: Jun. 22, 2018

(86) PCT No.: PCT/EP2018/066808
§ 371 (c)(1),
(2) Date: Mar. 25, 2020

(87) PCT Pub. No.: WO2019/063147
PCT Pub. Date: Apr. 4, 2019

(65) Prior Publication Data
US 2020/0278384 A1 Sep. 3, 2020

(30) Foreign Application Priority Data

Sep. 26, 2017 (DE) .................. 102017122283.9

(51) Int. Cl.
*G01R 15/18* (2006.01)
*G01R 19/00* (2006.01)
(52) U.S. Cl.
CPC ....... *G01R 15/186* (2013.01); *G01R 19/0092* (2013.01)
(58) Field of Classification Search
CPC ......... G01R 15/18; G01R 19/00; G01D 21/00
See application file for complete search history.

(56) References Cited

U.S. PATENT DOCUMENTS

| 4,654,662 A | 3/1987 | Orsdel |
| 2004/0061624 A1 | 4/2004 | Villicana et al. |

(Continued)

FOREIGN PATENT DOCUMENTS

| DE | 20 2008 017 797 U1 | 7/2010 |
| DE | 10 2011 075 353 A1 | 11/2012 |

(Continued)

OTHER PUBLICATIONS

International Search Report and Written Opinion for PCT/EP2018/066808 dated Aug. 2, 2018, 5 pages.

*Primary Examiner* — Dominic E Hawkins
(74) *Attorney, Agent, or Firm* — Foley & Lardner LLP

(57) ABSTRACT

The invention relates to a monitoring device for monitoring an energy parameter in a distribution station, wherein the monitoring device is designed to be attached to a voltage conductor in the distribution station, comprising: a device identifier for uniquely identifying the monitoring device, which device identifier is designed to be read out from immediate spatial proximity; a measurement unit for measuring an electrical current and/or a voltage of an alternating current flowing through the voltage conductor; an evaluation unit for determining the energy parameter based on the measured electrical current and/or voltage; and a communication unit for receiving a request from a readout device and for transmitting the energy parameter to the readout device if the received request comprises access information that is based on the device identifier. The invention further relates to a readout device as well as a monitoring system, a method for monitoring an energy parameter as well as a method for reading out a monitoring device.

19 Claims, 5 Drawing Sheets

(56) References Cited

U.S. PATENT DOCUMENTS

| | | | |
|---|---|---|---|
| 2008/0218154 A1* | 9/2008 | Ashburn | G01D 4/002 |
| | | | 324/119 |
| 2011/0004764 A1 | 1/2011 | Stuber | |
| 2014/0103905 A1 | 4/2014 | Johnson et al. | |
| 2014/0128093 A1* | 5/2014 | Das | H04W 64/006 |
| | | | 455/456.1 |
| 2015/0042488 A1* | 2/2015 | Bell | H02J 13/00034 |
| | | | 340/870.02 |
| 2015/0345986 A1* | 12/2015 | Yamamoto | H04Q 9/00 |
| | | | 340/870.02 |
| 2015/0377214 A1 | 12/2015 | Du Plessis | |
| 2018/0025877 A1* | 1/2018 | Froehner | H02J 13/0004 |
| | | | 324/424 |

FOREIGN PATENT DOCUMENTS

| | | |
|---|---|---|
| EP | 2 806 434 A1 | 11/2014 |
| WO | WO-2012/119648 A1 | 9/2012 |

* cited by examiner

MONITORING AN ENERGY PARAMETER IN A DISTRIBUTION STATION

CROSS-REFERENCE TO RELATED APPLICATIONS

This application is filed under 35 U.S.C. 371, filed from PCT/EP2018/066808 having a filing date of Jun. 22, 2018, which claims priority from DE 10 2017 122 283.9 having a filing date of Sep. 26, 2017, each of which are hereby incorporated by reference in their entirety for all purposes.

The present invention relates to a monitoring device for monitoring an energy parameter in a distribution station, a readout device for querying a monitoring device in a distribution station, a monitoring system for monitoring energy parameters as well as a method for monitoring an energy parameter and a method for querying a monitoring device in a distribution station.

Substations (also called grid stations) represent the link in a power network between medium voltage (10, 20 or 30 kV) and low voltage (230 or 400 V). Such substations usually comprise a medium-voltage switchgear, a transformer and a low-voltage distribution board (LVDB), which are installed in a housing (station building). The low-voltage distribution board consists of an infeed and several cable outlets that supply connected consumers with low voltage and/or collect fed-in energy from connected infeeders. There are usually five to ten cable outlets within the substation, wherein an individual cable connected to a cable outlet supplies several end customers (consumers and/or infeeders) along its course down a street of houses. So-called cable distribution cabinets (CDC), which usually comprise three to nine cable outlets, are available for subdividing the cable harnesses outside the substation. Individual dwelling or commercial units in turn are connected to the power network via a house connection box (HCB). Large commercial units can also be connected directly to a cable outlet in the substation.

Present-day power networks are primarily geared to a power generation that almost exclusively takes place centrally. Historically, electricity was generated centrally in large power stations, which allowed for the medium voltage to be kept relatively constant and a voltage drop to occur only between substation and consumer. Today, however, energy is increasingly also generated from regenerative sources. Part of the energy generation takes place locally in small feed-in stations. In particular, the locally generated share continues to increase. As a result, the load situation of the individual cable outlets in the substation as well as in the CDCs or HCBs can vary considerably. The load situation of the various medium-voltage lines can also vary considerably. For example, several photovoltaic plants for feeding in energy into the low-voltage system can be connected to one cable outlet, which can lead to a voltage increase above the admissible level (overvoltage).

New challenges are also unfolding on the side of the consumers. For example, when charging electric vehicles or stationary energy storage devices, short-term high loads and strong fluctuations in consumption can occur. If several charging points for electric vehicles are connected to a single cable outlet, a high strain is exerted on the cable outlet during charging. This can lead to a voltage depression (undervoltage) and an overloading of the cable harnesses.

As the technology used mostly still originates from a time in which no local generation and no time-dependent and/or short-term large-scale consumption had to be taken into account, neither the substations nor the CDCs and HCBs have an integrated measuring technology. Knowledge of the actual loads and load peaks of the individual cable outlets in the low-voltage system can therefore only be obtained on the basis of individual measurements on site.

Due to the large number of cable outlets and the large number of medium-voltage lines, a comprehensive and area-wide monitoring and measurement is currently considered to be uneconomical. Usually, measurements are only carried out selectively on problematic outlets and/or lines that have become known, for example, because of disturbances. As no real-life measurement data is available, development of the networks is mostly based on load assumptions on the basis of load curves, synchronisms and predictions. However, such instruments are often no longer applicable in the age of electromobility and in view of the use of local energy storage and local feeding-in of energy. This can lead to shortages in the provision of services as well as to voltage problems.

Measurement in the low-voltage and medium-voltage networks is usually carried out manually by maintenance personnel on site at the substations. For example, inductive current transformers, clamp-on ammeters, permanently installed inductive transformers on vertical fuse switch disconnectors or on low-voltage distribution boards, Rogowski coils with suitable signal processing, and Hall effect sensors are used. In addition to these measuring devices, a corresponding offset evaluation device and/or a data collector, a data concentrator or a head station usually has to be used, which can be designed, for example, as a control cabinet or as a portable measuring device. The sensors (transformers) are then connected to the corresponding evaluation device by cable. Attaching the sensors directly to a voltage potential, i.e. to a non-insulated part, is to be avoided since this can lead to potential carryover due to the necessary cable connection.

When using such wired solutions, the dangers for the maintenance personnel when connecting and removing the devices should not be underestimated. Manual handling requires compliance with safety standards. Because of the high voltages, it is often necessary for the maintenance personnel to be especially trained. On the one hand, the combination of sensor and evaluation device is expensive to buy, on the other hand, the application is also complex and expensive.

More recently, as an alternative to wired solutions, measuring devices have become known that can be read out via the mobile network and thus enable automatic monitoring without the deployment of operating personnel. The disadvantages of such solutions include, in particular, the high price as well as the fact that a large amount of data is collected that is unnecessary for network planning and monitoring.

In addition, the parallel use of different systems often results in disadvantages with respect to the manageability and a comparatively high error-proneness during installation and start-up.

DE 10 2011 075 353 A1 discloses an error control system for a distribution network station of a power grid. The error control system is intended for a distribution network station fed by a feed-in point of, for instance, a substation of an electric power grid, wherein the distribution network station comprises at least one inlet side facing the feed-in point with a corresponding inlet-side load switch and at least one outlet side facing away from the inlet side with a corresponding outlet-side load switch. The error control system comprises a measuring device which is locally allocated to the distribution network station for recording both inlet-side load flow information on the inlet side of the distribution network station and outlet-side load flow information on the outlet side of the distribution network station. The load flow information can particularly be information on the electrical current flow, which can optionally be accompanied by information on the electrical voltage.

DE 20 2008 017 797 U1 discloses a counting and measuring point system for counting and measuring the consumption or the generation of electrical energy. The system comprises a number of stationary connection devices which are connected to the power network and are suitable for withdrawal or feeding-in of electrical energy via consumption and/or generation units, which are provided with an identifier by means of which the connection holder can be identified, and at least one identifiable stationary functional unit for measuring and counting the electrical energy which is withdrawn or fed in by consumption and/or generation units at one or more stationary connection devices via an electrical conductor, wherein the functional unit comprises: aa. a device for detecting the identifier of the connection device, bb. an identifiable device for counting and measuring the electrical energy withdrawn from and/or fed into the connection device recorded according to (aa.), cc. a device for storing the counting and measurement data determined in accordance with (bb.) as well as the identifier of the connection device used as recorded in accordance with (aa.)

WO 2012/119 648 A1 discloses an energy automation system and a method for operating an energy automation system. In order to simplify the configuration of, in particular, an energy automation system with a comparatively large number of energy automation devices and to develop it in such a way that, as far as possible, no interruption of operation is necessary, a method for operating an energy automation system is proposed, wherein the energy automation system comprises a plurality of energy automation devices and at least one superordinate system control device for controlling and/or monitoring the energy automation devices. It is intended that an additional energy automation device is connected to the concentrator appliance and an automatic configuration of the concentrator device is carried out by integrating a device description file of the additional energy automation device into a concentrator data model of the concentrator appliance. The invention also relates to a corresponding energy automation system.

On this basis, the present invention addresses the problem of realizing a monitoring of energy parameters, which takes into account the actual requirements of energy suppliers for monitoring as well as the structure of the current networks and the existing operational procedures of energy suppliers. A kind of monitoring is to be realized that is inexpensive with regard to the installation and operating effort as well as with regard to the device costs and at the same time allows for a monitoring of relevant energy parameters with a low error-proneness and a high operational reliability.

According to the invention, this problem is solved by a monitoring device for monitoring an energy parameter in a distribution station. The monitoring device is designed to be attached to a voltage conductor in the distribution station and comprises: a device identifier for uniquely identifying the monitoring device, which device identifier is designed to be read out from immediate spatial proximity; a measurement unit for measuring an electrical current and/or a voltage of an alternating current flowing through the voltage conductor; an evaluation unit for determining the energy parameter based on the measured electrical current and/or voltage; and a communication unit for receiving a request from a readout device and for transmitting the energy parameter to the readout device if the received request comprises access information that is based on the device identifier.

In a further aspect, the problem illustrated above is solved by a readout device for querying a monitoring device in a distribution station, comprising: an interface for receiving a device identifier of the monitoring device, an access unit for determining access information that is based on the device identifier; and an interrogation unit for transmitting a query to the monitoring device and for receiving an energy parameter from the monitoring device, wherein the query comprises access information and wherein the interface is preferably designed to transmit the energy parameter to a central information collection point.

A further aspect of the present invention relates to a monitoring system for monitoring energy parameters in a distribution station, comprising at least one monitoring device and one readout device as described above as well as comprising a system identifier for uniquely identifying the monitoring system, which system identifier is designed to be read out from immediate spatial proximity.

In a further aspect, the invention relates to a method for monitoring an energy parameter in a distribution station, comprising a monitoring device designed to be attached to a voltage conductor in the distribution station, comprising the steps of: measuring an electrical current and/or a voltage of an alternating current flowing through the voltage conductor; determining an energy parameter based on the measured electrical current and/or voltage; receiving a request from a readout device; and transmitting the energy parameter to the readout device if the received request comprises access information that is based on a device identifier for uniquely identifying the monitoring device, wherein the device identifier is designed to be read out from immediate spatial proximity. In addition, an aspect of the invention relates to a method for querying a monitoring device in a distribution station, comprising the steps of: receiving a device identifier of the monitoring device; determining access information that is based on the device identifier; and transmitting a query to the monitoring device, wherein the query comprises access information; and receiving an energy parameter from the monitoring device.

Preferred embodiments of the invention are described in the dependent claims. It is understood that the monitoring device, the readout device, the monitoring system as well as the methods for monitoring and querying can be designed in accordance with the embodiments described for the monitoring device, the readout device, the monitoring system and the methods in the dependent claims.

According to the invention, the use of an integrated monitoring device is proposed. The device is designed to be attached to a voltage conductor in a distribution station and allows for the monitoring of an energy parameter which is based on an electrical current or a voltage. Herein, a distribution station is preferably understood to mean a substation, but also a CDC, an HCB or another component of the power network accessibly housed in a housing or box. The monitoring device has a compact design so that it can be fitted into existing distribution stations with little effort and so that it can remain in the distribution station during its operation. A permanent measurement and/or monitoring is made possible.

Starting from a measurement of an electrical current and/or voltage, the measured value is further processed in an evaluation unit and an energy parameter is determined. For example, filters can be used, averages can be formed or time stamps can be assigned. The energy parameter determined is transmitted to a readout device for further use. A request from the readout device is received via a communication unit of the monitoring device. It is checked whether this received request contains access information in order to ensure that no unauthorized retrieving of the energy parameter can occur. For this purpose, the monitoring device comprises a device identifier. If this device identifier is known to the readout device, retrieving of the energy parameter is enabled. If the access information is based on a device identifier of the monitoring device, the energy parameter is transmitted to the readout device via the communication unit. The device identifier is designed as a part of the monitoring device in such a way that it can only be detected from immediate spatial proximity to the monitoring device.

In the corresponding readout device, access information is generated in an access unit based on the device identifier, which access information is then used to transmit the corresponding request in order to receive the energy parameter from the monitoring device. The interface of the readout device can comprise, for example, a wireless communication interface or a plug connection.

A monitoring system comprises at least one monitoring device and one readout device. In addition, a system identifier is provided which uniquely identifies the monitoring system and which is also designed in such a way that it can only be read out from immediate spatial proximity.

Such a monitoring system is usually used to monitor several cable outlets in a distribution station, wherein, for each cable outlet, all three phases as well as the neutral conductor and/or protective conductor are monitored by separate monitoring devices. Monitoring devices which can be read out by a common readout device are then attached to all individual voltage conductors. The communication units of the monitoring devices and the interrogation unit of the readout device are in contact with one another. The system identifier of the monitoring system allows for a common approaching and/or reading out of the multiple monitoring devices of the monitoring system, which allows for efficient querying with little effort.

Herein, attachment to a voltage conductor in the distribution station is particularly understood to mean attachment to a voltage conductor within the distribution station, i.e. in the interior of a corresponding housing. Reading out from immediate spatial proximity is understood to mean registering an identifier in an immediate surrounding area. In particular, reading out if there is direct visual contact. Immediate spatial proximity is preferably understood to mean an area with a radius of a few centimeters around the monitoring device, for example an area within a radius of up to 10 cm, up to 20 cm, up to 50 cm or up to one meter. An energy parameter of an alternating current is measured, the voltage of the alternating current is understood to mean in particular the effective voltage.

In comparison with previous approaches for monitoring energy parameters in the context described above, the monitoring device according to the invention is considerably easier to assemble and start-up. The integrated, readable device identifier of the monitoring device as well as the corresponding system identification and the security of the communication between the monitoring device and the interrogation device based thereupon, to a large extent lead to configuration freedom. As the designations and/or identification features are factory-set, ease of installation is guaranteed. The demands made on assembly and operating personnel in terms of qualification are low.

Media breaks are prevented by retrieving the energy parameter and directly forwarding it via the interface of the interrogation device. The energy parameter can be fed directly into a corresponding computer system so that errors during manual data transmission are prevented. As the device identification and the system identification can be read out from immediate spatial proximity, a high level of data security and a low level of error proneness are achieved. The energy parameter can only be retrieved by reading out an identifier on site. Incorrect handling by assembly personnel is prevented.

As a long-distance communication module is not necessary, production costs remain low. As it is possible to attach an integrated compact device to a voltage conductor, installation can take place even in tight spaces in existing distribution stations. Easy retrofitting and use is possible in various situations in low-voltage and medium-voltage networks.

In a preferred embodiment of the monitoring device, the measurement unit is designed to measure the electrical current, and the evaluation unit is designed to determine an energy parameter that represents a maximum electrical current within a predefined time interval. For example, the maximum electrical current can be determined within an interval of 15 minutes. Monitoring the maximum electrical current is particularly relevant and meaningful with regard to network planning. Starting from a monitoring of the maximum electrical current alone, conclusions can be drawn that are relevant for network planning. In most cases it is not necessary to monitor a time course and a cost-efficient monitoring of the maximum values is sufficient.

In a further preferred embodiment, the device identifier is designed to be read out optically, preferably as a QR code or bar code; and/or the device identifier is attached to an outside of the monitoring device. By using a device identifier that can be read out optically, it is ensured that reading out is only possible when there is visual contact. Data security is increased. Unauthorized access to the energy parameter is not possible since the device identifier can only be read out if there is access to the distribution station. The use of a bar code or a QR code allows for easy handling. It can be attached to an outside of the housing of the monitoring device, for example, in the form of a sticker or by direct printing. The system identifier is preferably designed accordingly. The system identifier can then be attached to the inside of the station housing so that it can only be read out when the housing is open.

Preferably, the measurement unit is designed to measure the electrical current and comprises an inductive converter with a core surrounding the voltage conductor, which is designed divisibly to be attachable to the voltage conductor. A sensor based on the inductive measuring principle can be used for the actual measurement. For this purpose, it is necessary for the voltage conductor to be surrounded by or enclosed with a conductive core. In order to enable such an enclosure or to allow the monitoring device to be attached subsequently, the core is preferably designed to be divisible, i.e. it can be divided or separated for attachment in order to receive or enclose the voltage conductor. High measuring accuracy as well as simple, subsequent installability and a compact design are achieved.

In one embodiment, the monitoring device further preferably comprises an inductive converter for generating energy based on the alternating current in the voltage conductor. The same converter as for the measurement can be used as inductive converter. Energy generation is then also based on the alternating current in the voltage conductor. A voltage is induced. The energy gained can be used directly to supply the monitoring device. The monitoring device can also comprise an energy store for storing the energy gained, for example a rechargeable battery or a capacitor, in order to enable buffering and/or time-delayed operation. A direct supply of the monitoring device (without battery/capacitor) from the converter is preferred. By integrating energy generation, the maintenance effort is reduced. Replacement of a battery is not necessary. Efficient maintenance can be warranted.

Preferably, the monitoring device further comprises a memory unit for regularly storing the energy parameter, wherein the communication unit is designed to transmit at least one stored energy parameter. Advantageously, the energy parameter can be stored regularly so that the monitoring device can be operated in the form of a data logger. Reading out is then carried out at irregular intervals, wherein several stored energy parameters are transmitted during read-out. Operating costs are reduced.

Preferably, the communication unit is designed for wireless communication, preferably as a Bluetooth or wake-up transceiver. Correspondingly, the interrogation unit of the readout device is also preferably designed for wireless communication. Wireless communication between monitoring device and readout device allows for an efficient read-out. Using the readout device, operating personnel on site can read out the data of the monitoring device wirelessly and with little effort. By using a Bluetooth or wake-up transceiver, an energy-saving communication is achieved. The access information then corresponds, for example, to a Bluetooth pairing code or a wake-up sequence of a wake-up transceiver. This is particularly advantageous if, as described above, the energy supply is to be provided by energy harvesting by means of an inductive converter.

Further preferably, the monitoring device comprises a display unit for displaying the energy parameter, wherein the display unit is preferably designed as an e-ink display. For example, the display unit can be designed in such a manner that it displays the current measuring value when a control element (e.g. push button) is operated. This allows for quick and uncomplicated on-site reading out of the current value. A performance test can thus be simplified.

In a further embodiment, the monitoring device comprises a time measurement unit for defining measurement instants, wherein the measurement unit is designed to measure the electrical current and/or the voltage at the measurement instants; and/or wherein the evaluation unit is designed to determine the energy parameter at the measurement instants. When a time measurement unit is used, measurements can be carried out at predefined instants of time. Thus, relevant times can be examined more closely.

Additionally or alternatively to measuring the electrical current and/or the voltage, the measurement unit of the monitoring device can optionally also be designed to measure a temperature. It is also possible that a separate additional temperature sensor is provided in the monitoring device, which, for example, allows for the determination of a temperature of the voltage conductor and/or of a transformer. Based on the determined temperature, further relevant additional information can be obtained.

In an advantageous embodiment, the monitoring device is designed to be coupled to the voltage conductor by means of a fixing element, and is preferably arranged in a fully encapsulated housing to be protected from dirt, moisture and other environmental influences. For example, a holding band or a screw secured against loosening can be used as fixing element. The fixing element allows for easy attachment of the monitoring device to the voltage conductor. Efficient installation is achieved that can be carried out subsequently and that does not require any special skills or special tools and is therefore inexpensive to implement.

In an advantageous embodiment of the monitoring system according to the invention, the readout device comprises a readout unit for reading out the device identifier and the system identifier; and the interface is designed to transmit the device identifier and the system identifier to a central information collection point for storing an allocation between device identifier and system identifier. By means of the readout unit (e.g. bar code or QR code reader or smartphone camera), both the device identifier and the system identifier can be read out. Then an allocation between device identifiers of the at least one monitoring device, the monitoring system and the system identifier can be carried out. This allocation is stored centrally. The central information collection point can be designed as a local or remote (Internet) database. For subsequent read-out processes, it is no longer necessary to identify each individual monitoring device on the basis of the device identifier. It is sufficient for the system identifier to be read out and a composition of device identifiers of the different monitoring devices allocated to the monitoring system to be requested from the central information collection point. Operation efficiency is thus further increased. Several monitoring devices can be read out at once. A quick read-out with low demands on the operating personnel can take place.

In a further embodiment, the monitoring system comprises at least one device set to which at least one monitoring device is allocated; and at least one set identifier for uniquely identifying the at least one device set, which set identifier is designed to be read out from immediate spatial proximity, wherein the readout unit is designed to read out the set identifier; and the interface is designed to transmit the set identifier to the central information collection point and to receive the device identifier of the at least one monitoring device allocated to the device set from the central information collection point. For example, the different voltage conductors of a cable outlet (three phases, a neutral and/or protective conductor) can be monitored with one device set. The use of a set identifier along with the device identifier and the system identifier results in a further hierarchy level for monitoring and for querying. The multiple monitoring devices of a set belong to the same monitoring system and form a subunit within this monitoring system. By reading out the set identifier, the device identifiers of the individual monitoring devices allocated to the device set can be requested. Reading out the set identifier is sufficient and it is not necessary to read out each device identifier separately. Operability is further improved.

In an advantageous embodiment, the monitoring system comprises a central information collection point for storing an allocation between device identifier and system identifier, which central information collection point is designed to receive a system identifier and/or a set identifier, and to transmit at least one device identifier allocated to the monitoring system or the device set. In response to a query by the readout device including the system or set identifier, the device identifiers allocated to the monitoring system or the device set are transmitted. An efficient handling is ensured.

In an advantageous embodiment, the method for monitoring an energy parameter according to the invention comprises the steps of the method described above for querying the monitoring device as well as the following further steps: reading out a system identifier for uniquely identifying a monitoring system from immediate spatial proximity; and transmitting the system identifier to a central information collection point for storing an allocation between device identifier and system identifier, wherein the step of receiving the device identifier of the monitoring device comprises receiving the device identifier of the at least one monitoring device allocated to the monitoring system from the central information collection point. The information collection point is used to answer a query in order to make the corresponding allocated device identifiers available for the query on the basis of a read out system identifier. Separate reading out is no longer required after a one-time installation or start-up of the monitoring system. Read-out efficiency is increased.

For a start-up of a monitoring system, the following steps are preferably carried out: attaching the monitoring device to a voltage conductor in the distribution station; attaching the system identifier to the distribution station; reading out the device identifier and the system identifier from immediate spatial proximity; and transmitting the device identifier and the system identifier to a central information collection point for storing an allocation between device identifier and system identifier. Only for the start-up is it necessary to read out both the device identifier and the system identifier. After the device identifier and the system identifier have been transmitted to the central information collection point, an allocation can be made there. For future read-out processes, only the system identifier needs to be read out. The allocated monitoring devices can be obtained from the information collection point on the basis of the stored allocation.

In a further aspect, the invention relates to a computer program product with a data carrier on which program code is stored, which is designed to carry out the methods with the steps as described above when the program code is executed.

It is understood that the features mentioned hereinbefore and those to be commented on hereinafter can be used not only in the specified combination but also in other combinations or in isolation without departing from the scope of the present invention. The invention is described and explained in more detail by means of a number of selected exemplary embodiments in connection with the enclosed figures hereinafter. In the figures.

Figure 1:
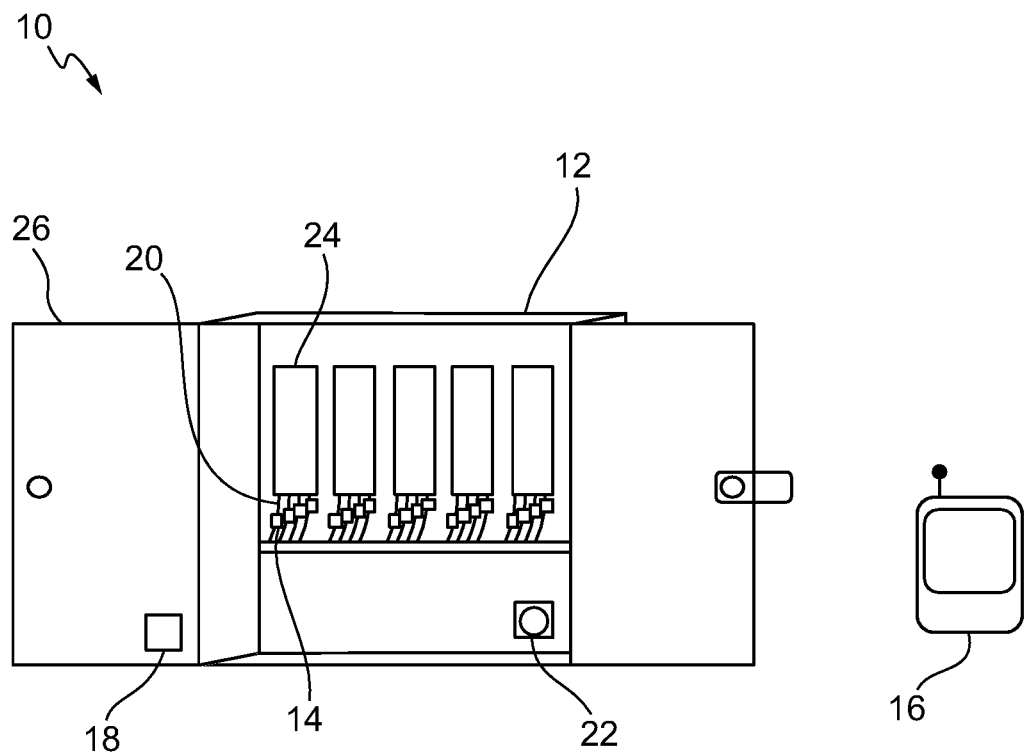
FIG. 1 shows a schematic illustration of a monitoring system according to the invention with monitoring device and readout device.

FIG. 1 illustrates a monitoring system 10 according to the invention for monitoring energy parameters in a distribution station 12. A distribution station 12 is illustrated which, as substation, represents the link between medium voltage and low voltage in the power distribution network. In the distribution station 12, an incoming medium voltage is transformed into a low voltage for the supply of end customers (consumers and/or infeeders) by means of a transformer.

The monitoring system 10 according to the invention comprises a monitoring device 14 with which an energy parameter in the distribution station 12 can be monitored. The monitoring system 10 further comprises a readout device 16 with which the monitoring device 14 can be queried and/or read out. Furthermore, the monitoring system 10 comprises a system identifier 18 which can be read out by a corresponding readout unit from immediate spatial proximity.

The monitoring system 10 allows for an efficient and appropriate monitoring of the electrical current and/or voltage in the distribution station. A medium-voltage line is connected to the distribution station 12 via a medium-voltage connection 22. The medium voltage is transformed into a low voltage and is passed on to end customers via a total of five cable outlets 24 in the illustrated example. Each cable outlet 24 comprises three phase conductors as well as a neutral conductor and/or a protective conductor. In the illustrated embodiment of the monitoring system, four voltage conductors 20 at all five cable outlets 24 are each separately provided with a total of 20 monitoring devices. As a matter of course, the monitoring of individual cable outlets or selected voltage conductors is also possible.

The monitoring device 14 allows for a measurement of an electrical current and/or a voltage of an alternating current flowing through the voltage conductor 20. On the basis of the measured value, an energy parameter is determined. This energy parameter can then be read out by the readout device 16. For this purpose, the readout device 16 transmits a query to the monitoring device 14, which query is based on a device identifier of the monitoring device 14 and comprises corresponding access information. Use of the access information ensures that the monitoring device 14 can only be queried by an appropriately authorized person or by an appropriately authorized readout device 16. Data security is warranted.

In the preferred embodiment illustrated, the system identifier 18 is attached to the interior of the distribution station 12 so that the system identifier is only accessible when a lockable door 26 of the distribution station 12 is open. Only a fitter or other authorized person can open the door 26 and read out the system identifier 18. On the basis of the system identifier 18 read out, the device identifiers of the multiple monitoring devices 14 can be determined so that the corresponding access information can be inferred and the monitoring devices 14 can be queried.

Figure 2:
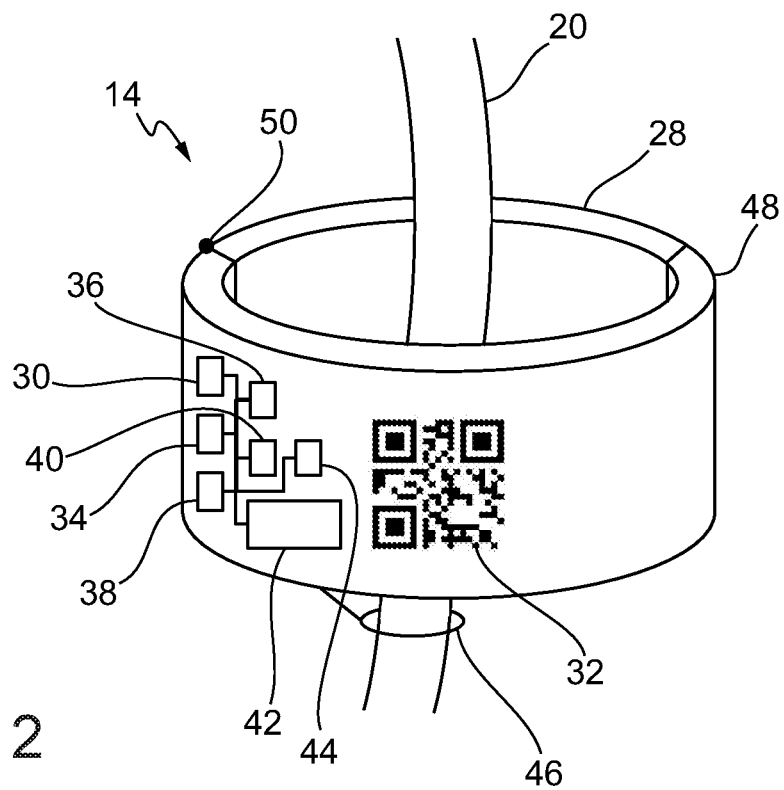
FIG. 2 shows an illustration of the monitoring device.

FIG. 2 illustrates a monitoring device 14 according to the invention, which is attached to a voltage conductor 20. As a small and compact device, the monitoring device 14 is designed in such a manner that it can be subsequently installed and used in existing distribution stations or directly at medium-voltage connections of large-scale consumers. The compact design ensures high compatibility with differently designed voltage conductors. The device is suitable to be used in different environments. The monitoring device 14 comprises a housing 28, which is designed to be fully encapsulated so that the different units of the monitoring device 14 are protected against the ingress of dirt and water and a usability in harsh environmental conditions is ensured.

For carrying out the actual measurement, the monitoring device 14 comprises a measurement unit 30, which allows for a measurement of the alternating current flowing through the voltage conductor 20 in order to determine the electrical current and/or the voltage. Conceivable measuring ranges for current measurements to be used in low-voltage networks are in the range of 0 to 250 A or 0 to 400 A or 0 to 600 A or 0 to 1,000 A or 0 to 1,600 A. For a use in medium-voltage networks, conceivable measuring ranges are, for example, in the range of 0 to 100 A or 0 to 200 A or 0 to 400 A or 0 to 630 A. With regard to the accuracy of the measurement, an accuracy class of 3 is usually sufficient for the intended application, which ensures cost-effective implementation.

The monitoring device 14 further comprises a device identifier 32, which is designed as a QR code in the illustrated exemplary embodiment. The device identifier 32 can only be read out from immediate spatial proximity. The illustrated QR code can only be read out when there is a direct visual connection. In other embodiments, it is also possible that a bar code, an RFID tag or another kind of identification is used as device identifier.

The monitoring device 14 further comprises an evaluation unit 34, in which an energy parameter is determined on the basis of the measured electrical current and/or voltage. The evaluation unit 34 is designed as a processor which can process the measured values. For example, filters can be used or average or instantaneous values can be determined.

The monitoring device further comprises a communication unit 36 which allows for a communication with the readout device. The communication unit 36 is designed as a Bluetooth or Bluetooth low energy chip, and the access information corresponds to a pairing code. It is understood that other communication connections can be used alternatively. Wireless communication results in an efficient readout of several monitoring devices 14 within a distribution station. In addition, no direct contact with the voltage conductor is necessary so that the safety of maintenance personnel is warranted.

Particularly, a maximum electrical current within a predefined time interval, e.g. 15 minutes, can be determined in the evaluation unit 34. Based on the monitoring of this energy parameter, an estimate of the loads present is possible that is sufficiently accurate for network planning. It is not necessary to carry out the measurements with a higher measurement frequency since the additional benefit of higher-resolution measurement values is small for network planning.

The monitoring device 14 further comprises a display unit 38 which serves to enable efficient monitoring of the currently measured measuring value. The display unit 38 allows for the current measuring value to be displayed. For this purpose, a button can be provided that triggers a display of the currently measured measuring value. Preferably, the display unit 38 is designed as an energy-saving e-ink display. The display unit 38 can, for example, display a maximum electrical current within the previous 15-minute interval at the push of a button.

Optionally, the monitoring device 14 comprises a time measurement unit 40 which can be designed as a real time clock (RTC). The time measurement unit 40 serves to determine measurement instants, wherein at each of these measurement instants a measurement of the electrical current and/or voltage is carried out by the measurement unit 30. The time measurement unit 40 also allows for a time stamp function so that time stamps can be assigned to the determined energy parameters, which makes the subsequent evaluation easier and better. The time measurement unit 40 is set during installation or already during manufacture of the monitoring device 14.

For the attachment of the monitoring device 14 to the voltage conductor 20, a fixing element 46 is provided, which can be designed, for example, as a holding band or as a screw secured against loosening.

Furthermore, the monitoring device 14 comprises an energy store 42, for example a primary battery, a rechargeable battery or a capacitor, by means of which the monitoring device 14 is supplied with energy.

In the exemplary embodiment illustrated, both the measurement and the gaining of the amount of energy necessary for the operation of the monitoring device 14 takes place based on the alternating voltage flowing through the voltage conductor 20 and the voltage induced by this alternating voltage. An inductive converter 44 is used for the energy supply, which interacts with the energy store 42 for the purpose of energy supply. The energy store serves as a buffer if the current flow of electricity is not sufficient for the supply.

Figure 3:
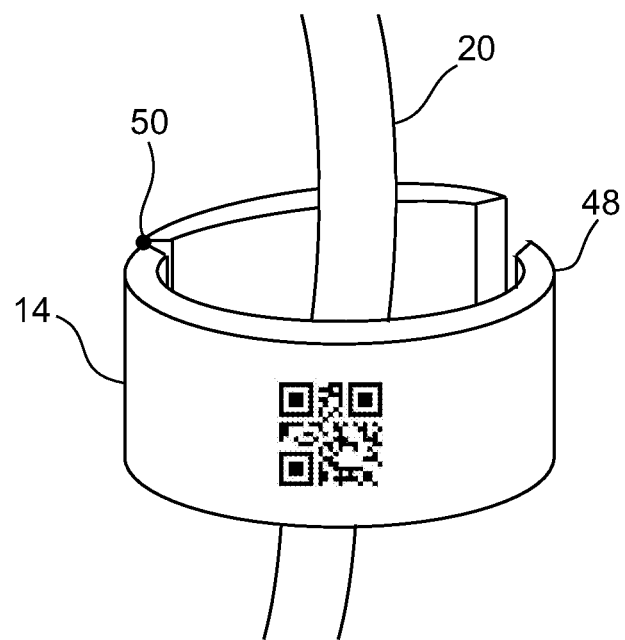
FIG. 3 shows a further illustration of the monitoring device with a split core for coupling it to a voltage conductor.

FIGS. 2 and 3 illustrate the monitoring device 14 comprising a metallic core 48 which surrounds the voltage conductor 20 and is designed to be foldable. For the measurement as well as for the energy supply by inductive coupling with the voltage conductor 20 it is necessary to enclose the voltage conductor 20 with an inductive element. This is achieved by a metallic core 48 enclosing the voltage conductor 20. In order to ensure that it can be installed subsequently, the core 48 is designed to be divisible. In the exemplary embodiment illustrated, a folding mechanism 50 is provided, by means of which a part of the core enclosing the voltage conductor 20 can be folded open for installation. Thus, the voltage conductor 20 does not need to be separated for installation of the monitoring device 14. The monitoring device 14 can be attached during operation and on an existing system. Installation can also take place when cables, conductors or bus bars are already connected.

An energy parameter is stored every 15 minutes that represents the maximum electrical current within the previous 15-minute interval. This can be achieved, for example, by storing a value in the nonvolatile memory once a minute, which is overwritten when a larger value is detected. The interval for the energy parameter can also be less than 15 minutes.

The monitoring device 14 can also be operated at a voltage potential, since due to the wireless connection no cable connection is required for the readout.

In the event that the monitoring device 14 is to be used to monitor a voltage, the voltage value can be picked up by the measurement unit in a wired connection. The voltage value can then be given a time stamp for later power and load flow calculations. If the voltage is to be monitored, the monitoring device 14 can preferably be applied at the undervoltage connections of a feeding transformer or at an infeed of the low-voltage supply, at the cable outlet or at a bus bar of the low-voltage supply or mounted in the house connection box. In the area of medium-voltage supply, a resistive coupling or a capacitive voltage divider in the measurement unit is conceivable. By monitoring the voltage, a determination of the load flow is possible.

Figure 4:
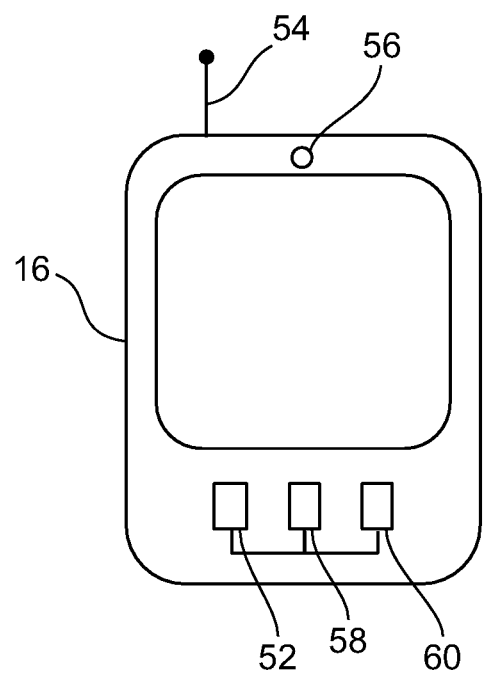
FIG. 4 shows an illustration of the readout device.

FIG. 4 illustrates an embodiment of the readout device 16 according to the invention. An implementation as a tablet computer is illustrated. Alternatively, the readout device 16 according to the invention can also be designed as a toughbook, smartphone or smartphone app using the sensors integrated in the smartphone.

The readout device 16 comprises an interface 52, which can be designed as a physical connection interface (plug connection), as a wireless communication unit or as a software interface or as a combination of the aforementioned types of interfaces. The interface 52 serves to receive a device identifier of the monitoring device. On the one hand, the device identifier can be received from a database via a wireless connection 54. On the other hand, direct readout can also be carried out by means of a readout unit 56 coupled to the interface 52, wherein the readout unit 56 can be designed as a camera of the tablet. In addition, the interface 52 can be used to forward the energy parameter received from the monitoring device and, for example, to transfer it to a database. For this purpose, a mobile data connection or a WLAN connection is usually provided.

Furthermore, the readout device 16 comprises an interrogation unit 58, which is designed for communication with the communication unit of the monitoring device. Correspondingly, the interrogation unit is also designed as a Bluetooth, Bluetooth low energy, NFC or other radio transceiver. Via the interrogation unit 58, the readout device 16 sends a request to the monitoring device and the response of the monitoring device with the energy parameter determined in the monitoring device is received.

In order to get access to the monitoring device and to be able to retrieve the energy parameter, the readout device 16 further comprises an access unit 60. In this access unit 60, corresponding access information is determined on the basis of the device identifier of the monitoring device to be queried, which has previously been received via the interface. Only if the request to the monitoring device is based on this access information is it ensured that the request is authorized and that the monitoring device may transmit the energy parameter.

Thus, in order to connect the monitoring device to the readout device 16, a unique identification based on the device identifier is used. Only of this device identifier is known to the readout device 16 can the monitoring device be queried. It is not possible to read out monitoring devices whose device identifiers are not available.

Figure 5:
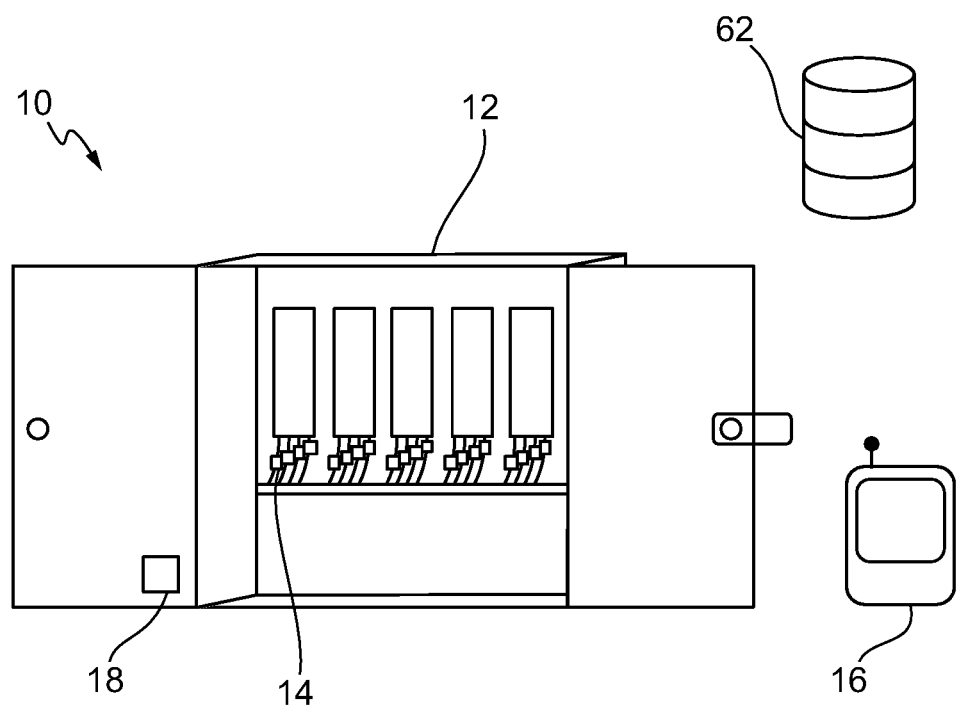
FIG. 5 shows a schematic illustration of a monitoring system according to the invention and a central information collection point.

FIG. 5 illustrates a monitoring system 10 which, in addition to the monitoring device 14, the readout device 16 and the system identifier 18, also comprises a central information collection point 62. The central information collection point 62 represents a central instance or a central server. For example, it can be designed as an Internet server or an Internet database. An allocation between device identifiers of the different monitoring devices 14 and the system identifier 18 of the monitoring system 10 is stored in the central information collection point.

Querying the plurality of monitoring devices 14 in a distribution station can then take place in such a way that the readout device 16 first reads out the system identifier 18 of the monitoring system 10. For this purpose, an appropriately designed readout unit of the readout device 16 can be used. The system identifier 18 is then transmitted to the central information collection point 62. In response to this request, the central information collection point 62 transmits the device identifiers allocated to the system identifier 18 back to the readout device 16. Based on the transmitted device identifiers, the readout device 16 can then read out the monitoring devices 14 in the distribution station and receive the corresponding energy parameters. These energy parameters can then optionally be transmitted back to the central information collection point 62 and can be fed from there, for example, into a corresponding information system (e.g. SAP).

In order to start up the central information collection point 62 as well as the monitoring system 10, it is necessary for the allocation between monitoring system 10 and monitoring devices 14 to take place first. For this purpose, the readout unit of the readout device 16 is preferably designed to record both the system identifier 18 and the device identifiers of the monitoring devices 14. The detected identifiers are then transmitted to the central information collection point 62 for generation of the allocation. After the allocation has been generated once, the allocation can be used for subsequent readout operations and it is sufficient to retrieve the system identifier in order to query the monitoring devices 14.

Figure 6:
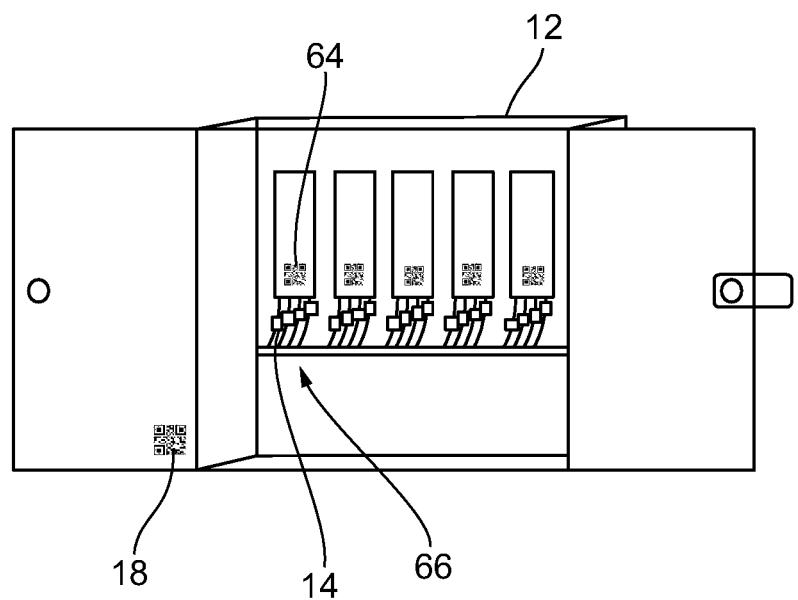
FIG. 6 shows a schematic illustration of the use of system and set identifiers in a distribution station.

As illustrated in FIG. 6, the system identifier 18 is preferably also designed as a QR code and is attached to an interior of the distribution station 12. The system identifier 18 can therefore only be read out when the door of the distribution station 12 is open. This is only possible if the door is unlocked. Only appropriately authorized personnel can thus read out the system identifier 18 and access the energy parameters of the monitoring devices 14.

Furthermore, as illustrated, in addition to the device identifier of the monitoring devices 14 and the system identifier 18 of the monitoring system, the individual cable outlets can also be provided with set identifiers 64. QR codes can also be used here. In order to make an individual cable outlet uniquely identifiable, the four and/or five voltage conductors of a cable outlet or the monitoring devices attached to them are allocated to a device set 66. The allocation of the different cable outlets to a facility or a system is made based on the system identifier.

Figure 7:
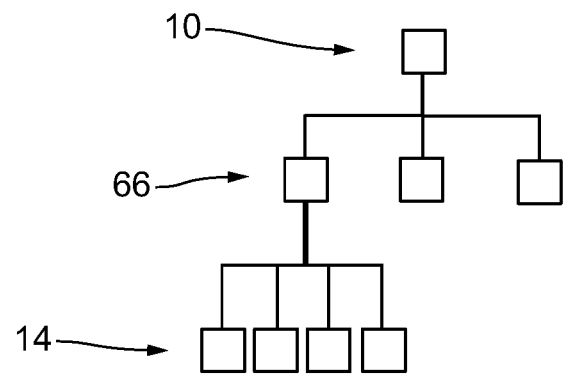
FIG. 7 shows an illustration of a hierarchic allocation of device identifiers to set identifiers and a system identifier.

FIG. 7 schematically illustrates the corresponding hierarchical addressing. A monitoring system 10 comprises a plurality of device sets 66, which in turn each comprise a plurality of monitoring devices 14. Each level separately has a corresponding identifier (system identifier, set identifier and device identifier). The set identifier is used in the same way as the system identifier. It is therefore possible to read out the set identifier and to determine the device identifiers allocated to the set identifier by communicating with the central information collection point. For this purpose, a configuration in the sense of an initialization must be carried out first. This is realized when the system is started up by first reading in the system identifier, then the set identifiers and finally the device identifiers by means of the readout unit 56 of the readout device 16 in order to transmit them to the central information collection point.

Figure 8:
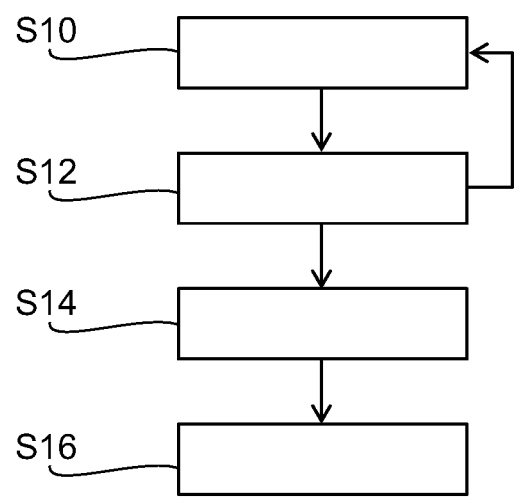
FIG. 8 shows an illustration of the sequence of a method according to the invention for querying a monitoring device.

FIG. 8 schematically illustrates the sequence of a method for monitoring an energy parameter in a distribution station according to the invention. The method comprises the steps of measuring S10 an electrical current and/or a voltage, of determining S12 an energy parameter based thereupon, of receiving S14 a request by a readout device, and of transmitting S16 the energy parameters to the readout device. Such a readout method is used as an operating method in a monitoring device. For example, a processor of the monitoring device can be configured accordingly to carry out the individual method steps. As illustrated, the steps of measuring S10 and determining S12 of the energy parameter are carried out repeatedly in most cases. The steps of receiving S14 and transmitting S16 are only carried out if a corresponding request from a readout device has been received.

Figure 9:
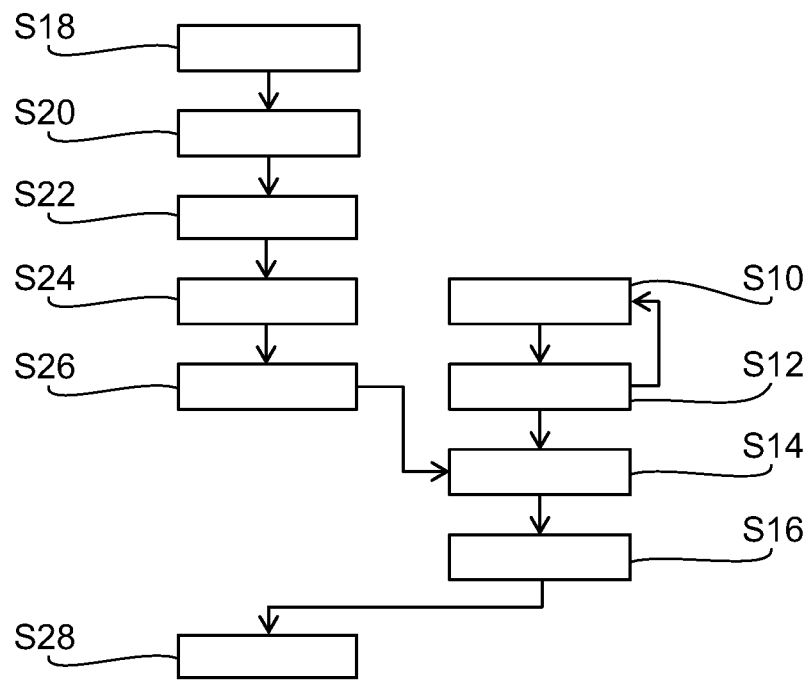
FIG. 9 shows an illustration of a preferred embodiment of the method according to the invention for monitoring an energy parameter.

FIG. 9 illustrates the sequence of a method for monitoring an energy parameter, which includes both the steps carried out in the monitoring device and the steps carried out in the readout device. In addition to the steps S10 to S16 described above, the steps of reading out S18 a system identifier, of transmitting S20 the system identifier to a central information collection point, of receiving S22 a device identifier of the monitoring device from the central information collection point, of determining S24 access information that is based on the device identifier, and of transmitting S26 a request to the monitoring device are carried out. After the corresponding method in the monitoring device has been completed, the readout device carries out a step of receiving S28 an energy parameter from the monitoring device.

In the illustration, steps S18 to S28 shown on the left side are carried out in the readout device or in a processor of the readout device. The steps S10 to S16 are carried out in the monitoring device or in the processor of the monitoring device.

Figure 10:
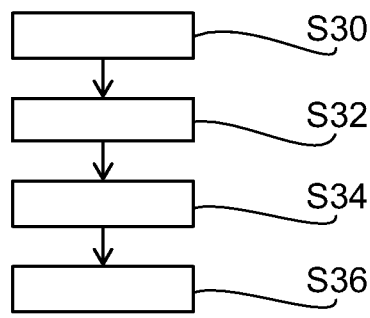
FIG. 10 shows a method for starting up a monitoring system.

Finally, FIG. 10 illustrates a method for starting up a monitoring system. The method comprises the steps of attaching S30 the monitoring device to a voltage conductor in the distribution station, of attaching S32 the system identifier to the distribution station, of reading out S34 the device identifier and the system identifier and of transmitting S36 the device identifier and the system identifier to a central information collection point. The method for starting up can, for example be realized as a computer program or as a smartphone/tablet app.

When starting up, it is therefore assumed that the monitoring devices have already been factory-set with the corresponding device identifiers which can be read in during installation on site. Moreover, set identifiers are already provided. The set identifiers of the different device sets are then read in as well and are directly attached to the corresponding parts of the system, for example in the form of stickers. In addition, the installation location of the system is uniquely defined by attaching the system identifier, whereby all devices are uniquely identified. The fitter is guided through the installation process on the software side to ensure the correct allocation of the installation. For this purpose, a smartphone or tablet app is preferably provided as readout device. First, the different identifiers are scanned in in an order specified by the software. When the system identifier is read in, the GPS coordinates and an orientation of the readout device (viewing direction) are preferably stored at the same time by registering the earth's magnetic field. In addition, the operating personnel can be asked to generate an image as additional information. Through the additional registering of the GPS coordinates and the orientation, an automatic software allocation of the system identifier, the set identifiers and device identifiers to the system-related attributes (for example name, technical data or maps) can take place. It is understood that a plausibility check can be initiated if the data is unclear or incomplete.

To read out the monitoring devices in a distribution station, it is then only necessary to establish access to the monitoring station. Then the monitoring devices can be read out again by a software-guided method. For this purpose, the system identifier and/or the set identifiers can be read in, in order to then obtain the device identifiers of the monitoring devices installed in the distribution station. The energy parameters determined can be temporarily stored locally on the readout device and optionally be transmitted to the central information collection point if a data connection is available. The determined energy parameters are also transmitted to the central information collection point for further system-side processing without media breaks.

Preferably, the monitoring system according to the invention is used in walk-in and non-walk-in substations of the power distribution network as well as in cable distribution cabinets, house connection boxes and medium-voltage lines. An application in the industrial environment or in building technology in control cabinets or in other connection boxes is also conceivable. Applications in charging infrastructure, in power stations, in control technology, in industry, in photovoltaics or wind energy, in measuring technology for electromobility as well as in measurement technology for sector clutches are possible.

The invention has been comprehensively described and explained by means of the figures and the description. The description and explanations are to be regarded as examples and not as limiting the scope of the invention. The invention is not limited to the disclosed embodiments. For the person skilled in the art, other embodiments or variants follow from the use of the present invention as well as from a thorough analysis of the drawings, the description and the following patent claims.

In the patent claims, the words "comprising" and "having" do not exclude the presence of further elements or steps. The indefinite article "a" or "an" does not exclude the presence of a plural. A single element or a single unit can execute the functions of several of the units named in the patent claims. The different units can partially or fully be implemented in hardware or software. The mere mention of some measures in several different dependent patent claims is not to be understood to the effect that a combination of these measures cannot be used advantageously as well. A computer program can be stored/distributed on a non-volatile data carrier, for example on an optical memory device or on a solid-state drive (SSD). A computer program can be distributed together with hardware and/or as part of hardware, for example on the Internet or via wire-bound or wireless communication systems. Reference signs in the patent claims are not to be understood as limiting the scope of the invention.

The invention claimed is:

1. In a distribution station of a power distribution network, a monitoring device adapted to be attached to a voltage conductor of the distribution station for monitoring an energy parameter, the monitoring device comprising:
a device identifier uniquely identifying the monitoring device, such identification to be determined from a position in immediate spatial proximity to the device identifier;
a measurement unit for measuring at least one of the electrical current and the voltage of an alternating current flowing through the voltage conductor;
an evaluation unit for determining said energy parameter based upon the result of said measurement unit; and
a communication unit for receiving a request to access the energy parameter from a readout device reading the device identifier and transmitting said energy parameter directly to the readout device only if the received request comprises access information corresponding to the device identifier.

2. The monitoring device according to claim 1, wherein the energy parameter represents a maximum electrical current within a predefined time interval.

3. The monitoring device according to claim 1, wherein the device identifier is designed to be read out optically; and is placed on an exterior of the monitoring device.

4. The monitoring device according to claim 1, wherein the measurement unit comprises an inductive converter with a core surrounding the voltage conductor, which core is designed divisibly to be attachable to the voltage conductor.

5. The monitoring device according to claim 1, further comprising an inductive converter for generating energy based on the alternating current in the voltage conductor.

6. The monitoring device according to claim 1 wherein the monitoring device is adapted to read out optically as at least one of a QR code and a bar code.

7. The monitoring device of claim 1, wherein the energy parameter is an average value formed of the at least one of the electrical current and the voltage current measured by the measurement unit within a predefined time interval.

8. The readout device of claim 1, wherein the communication unit transmits the energy parameter to the readout device wirelessly.

9. In a distribution station of a power distribution network including a monitoring device with a device identifier, and a readout device for querying the monitoring device, the readout device comprising:
- an interface for receiving the device identifier; and
- an access unit for determining access information based upon the device identifier; and
- an interrogation unit for (i) transmitting a request comprising the access information to the monitoring device, and (ii) receiving an energy parameter directly from the monitoring device.

10. The readout device of claim 9, wherein the interface is further adapted to transmit the energy parameter to a central information collection point.

11. A monitoring system for monitoring energy parameters in a distribution station of a power distribution network, the monitoring system comprising:
- a monitoring device for monitoring an energy parameter;
- a readout device for querying the monitoring device;
- the monitoring device comprising a device identifier for uniquely identifying the monitoring device, a measurement unit for measuring at least one of the electrical current and the voltage of an alternating current flowing through the voltage conductor;
- an evaluation unit for determining said energy parameter based upon the result of said measurement unit;
- a communication unit for receiving a request from the readout device, and transmitting the energy parameter directly to the readout device only if the received request comprises access information corresponding to the device identifier;
- the readout device comprising an interface for receiving the device identifier, an access unit for determining access information based upon the device identifier, and an interrogation unit for (i) transmitting a request comprising the access information to the monitoring device, and (ii) receiving an energy parameter from the monitoring device; and
- a system identifier for uniquely identifying the monitoring system, which system identifier adapted to be read out from the immediate spatial proximity.

12. The monitoring system according to claim 11, wherein the readout device comprises a readout unit for reading out the device identifier and the system identifier; and
- the interface adapted to transmit the device identifier and the system identifier to a central information collection point for storing an allocation between the device identifier and the system identifier.

13. The monitoring system according to claim 11, wherein the readout device comprises a readout unit for reading out the system identifier;
- the interface is adapted to transmit the system identifier to a central information collection point for storing an allocation between device identifier and system identifier; and
- the interface is designed to receive the device identifier of the at least one monitoring device allocated to the monitoring system from the central information collection point.

14. The monitoring system according to claim 11, comprising:
- at least one device set to which at least one monitoring device is allocated; and
- at least one set identifier for uniquely identifying the at least one device set, which set identifier is adapted to be determined from a position in immediate spatial proximity, wherein the readout unit is adapted to read out the set identifier; and
- the interface adapted to transmit the set identifier to the central information collection point and to receive the device identifier of the at least one monitoring device allocated to the device set from the central information collection point.

15. The monitoring system according to claim 11, further comprising a central information collection point for storing an allocation between the device identifier and the system identifier, which is designed to receive at least one of a system identifier and a set identifier; and transmit at least one device identifier allocated to the monitoring system or the device set.

16. The method for starting up a monitoring system according to claim 11, comprising:
- attaching the monitoring device to a voltage conductor in the distribution station;
- attaching the system identifier to the distribution station;
- reading out the device identifier and the system identifier from immediate spatial proximity; and
- transmitting the device identifier and the system identifier to a central information collection point for storing an allocation between the device identifier and the system identifier.

17. A method for monitoring an energy parameter in a distribution station with a monitoring device for attachment to a voltage conductor in the distribution station, comprising the steps of:
- measuring at least one of an electrical current or a voltage of an alternating current flowing through the voltage conductor;
- determining the energy parameter based on at least one of the measured electrical current and voltage;
- receiving a request from a readout device; and
- transmitting the energy parameter directly to the readout device if the received request comprises access information that is based on a device identifier for uniquely identifying the monitoring device, wherein the device identifier is designed to be read out from immediate spatial proximity.

18. The method according to claim 17 comprising:
- receiving a device identifier of the monitoring device;
- determining access information that is based on the device identifier;
- transmitting a request to the monitoring device, wherein the request comprises access information;
- receiving an energy parameter from the monitoring device;
- reading out a system identifier for uniquely identifying a monitoring system from immediate spatial proximity; and
- transmitting the system identifier to a central information collection point for storing an allocation between device identifier and system identifier,
- wherein the step of receiving the device identifier of the monitoring device comprises receiving the device identifier of the at least one monitoring device allocated to the monitoring system from the central information collection point.

19. A method for querying a monitoring device in a distribution station, the method comprising:
  receiving a device identifier of the monitoring device;
  determining access information that is based on the device identifier;
  transmitting a request to the monitoring device, wherein the request comprises access information; and
  receiving an energy parameter directly from the monitoring device.

* * * * *